United States Patent
Huang (10) Patent No.: US 7,291,888 B2
(45) Date of Patent: Nov. 6, 2007

(54) ESD PROTECTION CIRCUIT USING A TRANSISTOR CHAIN

(75) Inventor: Shao-Chang Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/152,264

(22) Filed: Jun. 14, 2005

(65) Prior Publication Data

US 2006/0278930 A1 Dec. 14, 2006

(51) Int. Cl.
*H01L 23/62* (2006.01)
(52) U.S. Cl. ............... 257/361; 257/362; 257/363; 257/355; 257/E29.014; 257/E29.327; 257/E29.066
(58) Field of Classification Search ............... None
See application file for complete search history.

(56) References Cited

U.S. PATENT DOCUMENTS

2006/0050451 A1* 3/2006 Jen-Chou ............... 361/56

\* cited by examiner

*Primary Examiner*—Sue A. Purvis
*Assistant Examiner*—Fazli Erdem
(74) *Attorney, Agent, or Firm*—K & L Gates LLP (57) ABSTRACT

An electrostatic discharge (ESD) protection circuit for dissipating an ESD current from a first pad to a second pad during an ESD event. The ESD protection circuit includes a first bipolar transistor having an emitter coupled to the first pad. A second bipolar transistor having a base and a collector coupled to the second pad is used. Zero or more bipolar transistors are sequentially coupled between the first and second bipolar transistors in a base-to-emitter manner. A collector of the first bipolar transistor and the sequentially coupled transistors is connected to a base of a subsequently coupled bipolar transistor for helping to turn on the first, second and sequentially coupled bipolar transistors to provide a current path from the first pad to the second pad during an ESD event.

19 Claims, 6 Drawing Sheets

ESD PROTECTION CIRCUIT USING A TRANSISTOR CHAIN

BACKGROUND

The present invention relates generally to integrated circuit (IC) designs, and more particularly to electrostatic discharge (ESD) protection circuits for ICs.

Electrostatic discharge (ESD) can enter an integrated circuit (IC) through bond pads, which are connections from outside circuitry to the IC. They are usually used for supplying electric power, electric ground, and electric signals. These electrostatic discharges can be created in many different ways. For example, when parts of an external pad leading to an IC are touched by a person, he or she can create static electricity strong enough to destroy circuitry of the IC. In a metal-oxide-semiconductor (MOS) transistor, the gate oxide is most susceptible to damage. A voltage slightly higher than the supply voltage can destroy the gate oxide of the transistor. ESD created by common environmental sources can carry up to tens of thousands of volts when it occurs. Such voltages can damage the circuitry even though the charge and any resulting current are extremely small. To avoid these voltages damaging an IC, it is important to discharge any static electricity at the moment of its occurrence. In order to protect the IC from ESD, protection circuits are necessary.

An ESD protection circuitry needs to allow an IC to operate normally while providing protection for the IC during ESD events. ESD protection circuitry is typically implemented to the IC at its bond pads. The protection circuit can isolate itself from normal operation of the IC by blocking current from flowing therethrough. During operation of the IC, electric power is supplied to a VDD pad and electric ground is supplied to a VSS pad. Many other pads are assigned to carry electronic signals that are supplied from outside or generated from the IC. During an ESD event, the protection circuitry must quickly conduct current so that the electrostatic charge is conducted to VSS ground, and thus dissipated, before damaging the IC.

One of the commonly used schemes for ESD protection circuit is to implement a string of diodes to provide the necessary voltage drop to prevent normal operation voltage opening up the current path for dissipating ESD charge. The diode string is designed to provide the dissipating path for ESD charge when the high voltage of ESD reaches the diodes. However, the diode string tends to have a high turn-on resistance while also susceptible to current leakage and over voltage issues.

Therefore, desirable in the art of ESD protection circuit designs are additional designs that can provide a dissipating path for ESD charge with a low turn-on resistance.

SUMMARY

The present invention provides an electrostatic discharge (ESD) protection circuit for dissipating an ESD current from a first pad to a second pad during an ESD event. The ESD protection circuit includes a first bipolar transistor having an emitter coupled to the first pad. A second bipolar transistor having a base and a collector coupled to the second pad is used. Zero or more bipolar transistors are sequentially coupled between the first and second bipolar transistors in a base-to-emitter manner. A collector of the first bipolar transistor and the sequentially coupled transistors is connected to a base of a subsequently coupled bipolar transistor for helping to turn on the first, second and sequentially coupled bipolar transistors to provide a current path from the first pad to the second pad during an ESD event.

The construction and method of operation of the invention, however, together with additional objects and advantages thereof will be best understood from the following description of specific embodiments when read in connection with the accompanying drawings.

DESCRIPTION

Figure 1:
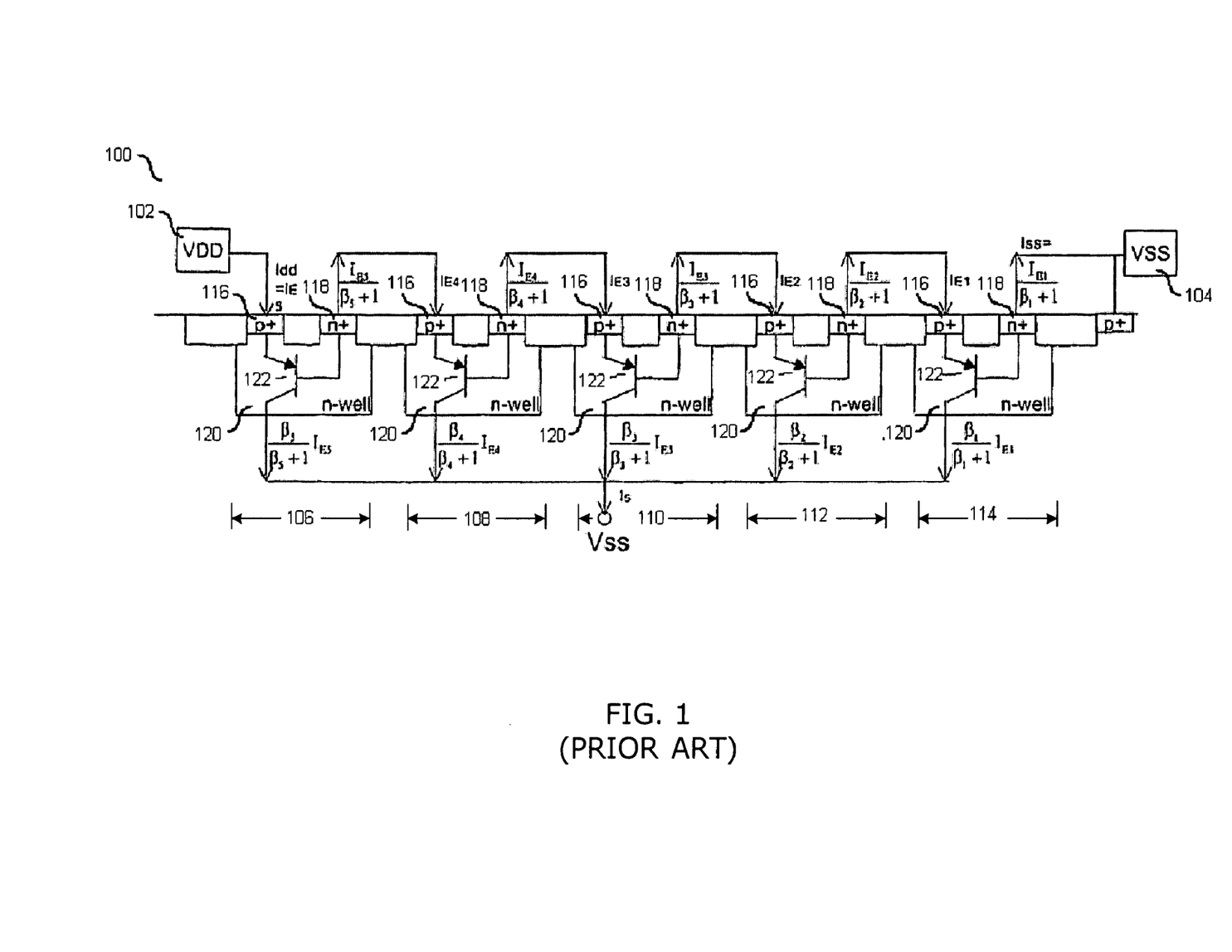
FIG. 1 illustrates a cross-section of a conventional ESD protection circuit with a series of PNP diodes.

FIG. 1 illustrates a cross-section of a conventional ESD protection circuit 100 with a string of diodes connected between a supply voltage (VDD) pad 102 and a complementary supply voltage (VSS) pad 104. Diodes 106, 108, 110, 112, and 114 are all identical, each of which contains a P+ doped region 116 and an N+ doped region 118 in an N-type well 120. Parasitic vertical PNP transistors 122 are formed within all diodes where the emitters are connected to the P+ doped regions 116, the bases are connected to the N+ doped regions 118, and the collectors are connected to VSS through a semiconductor substrate. The diodes 106, 108, 110, 112, and 114 are placed in series by physically wiring each N+ doped region 118 to the P+ doped region 116 of the subsequent diode.

Since each diode provides a forward voltage drop, voltage used for normal operation of an IC will not be enough to pass through all the diodes. During an ESD event, the high ESD voltage can pass through all diodes to open a current path for the ESD to flow to VSS before damaging the IC. However, such diode string creates a high turn-on resistance, thereby slowing down the ESD performance. Furthermore, in normal operation, current leaks from the VDD pad 102 to the substrate through the parasitic vertical PNP transistors 122. The leakage current also becomes an issue due to the configuration of the diode string.

Figure 2A:
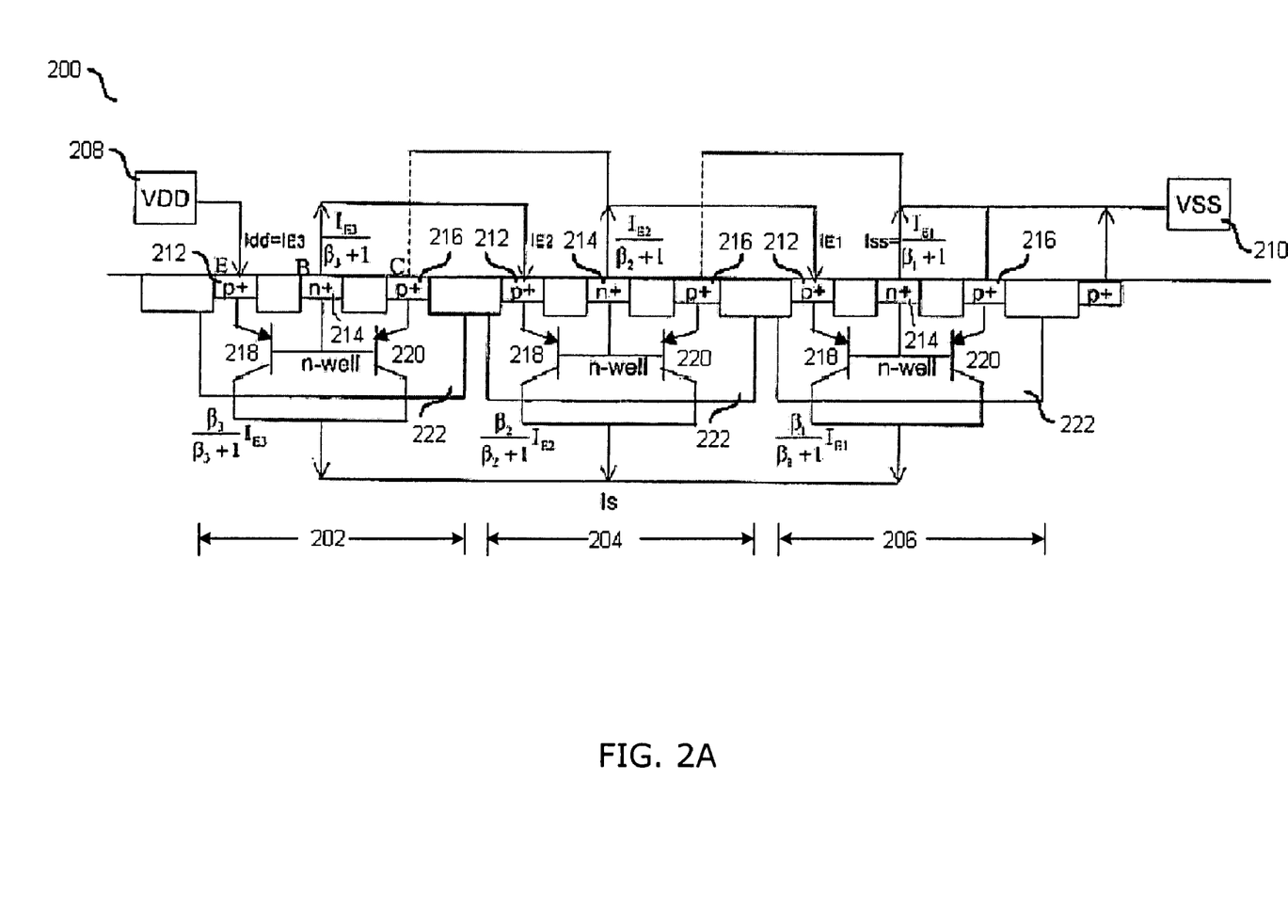
FIG. 2A illustrates a cross-section of a semiconductor structure serving as an ESD protection circuit in accordance with one embodiment of the present invention.

FIG. 2A illustrates a cross-section of a semiconductor structure 200 serving as an ESD protection circuit in accordance with one embodiment of the present invention. The structure 200 shows a transistor chain made up of three lateral PNP bipolar transistors 202, 204, and 206. The transistor chain is implemented between a VDD pad 208 and VSS pad 210. Each of the PNP bipolar transistors 202, 204, and 206 are identical, with each containing a P+ doped region 212 as the emitter, an N+ doped region 214 as the base, and another P+ doped region 216 as the collector. Parasitic vertical PNP bipolar transistors 218 and 220 are formed within N-type wells 222 for all lateral transistors.

The emitters of the parasitic vertical PNP transistors 218 are connected to the P+ doped regions 212 while the emitters of parasitic vertical PNP transistor 220 are connected to the P+ doped region 216. The bases of both parasitic vertical PNP transistors 218 and 220 are connected to the N+ doped regions 214, and the collectors of both PNP transistors 218 and 220 are connected to VSS through a semiconductor substrate. The PNP bipolar transistors 202, 204, and 206 are physically chained together by wire. To form this chain, each N+ doped region 214 is connected both to the P+ doped region 212 of the subsequent transistor, which is closer to the VSS pad 210, and to the P+ doped region 216 of the previous transistor, which is closer to the VDD pad 208.

With this configuration, the turn-on resistance of the ESD protection circuit is lowered as opposed to a conventional diode-string type of ESD protection circuit. When an ESD event occurs, the lateral PNP bipolar transistors are easily turned on, thereby allowing quick dissipation of the harmful charges from the VDD pad 208 to the VSS pad 210.

Figure 2B:
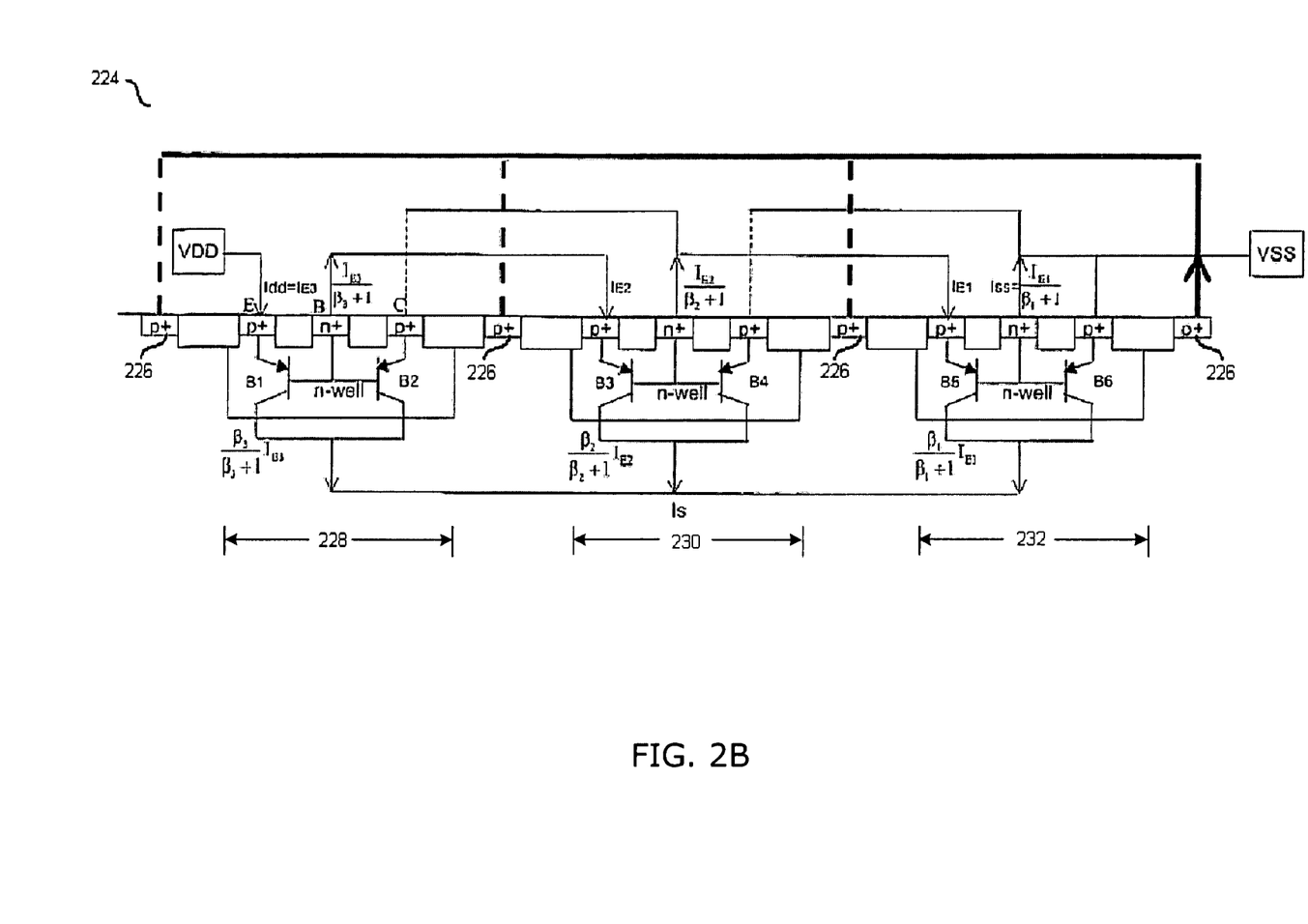
FIG. 2B illustrates a cross-section of a semiconductor structure serving as an ESD protection circuit in accordance with another embodiment of the present invention.

FIG. 2B illustrates a cross-section of a semiconductor structure serving as an ESD protection circuit 224 in accordance with another embodiment of the present invention. In this embodiment, leakage current is significantly controlled during normal operation of an IC. Various P-type substrate doped regions 226 are implemented between neighboring PNP bipolar transistors 228, 230, and 232. The P-type substrate doped regions 226 are all connected over the surface to allow leakage to be controlled by the grounded P+ regions. This alteration can further avoid serious leakage issues. Other than the alteration made by implementing the extra P-type substrate doped regions 226, the structure 224 functions in the same manner as the structure 200 shown in FIG. 2A.

It is noted that the P+ region 226 can isolate the vertical bipolar transistors for reducing leakage current through the first, second and sequentially coupled bipolar transistors in a normal operation state. Because the P+ region 226 will sink current from one bipolar transistor to another, the bipolar transistor will not be substantially affected by the previous or subsequent bipolar transistors.

Figure 3A:
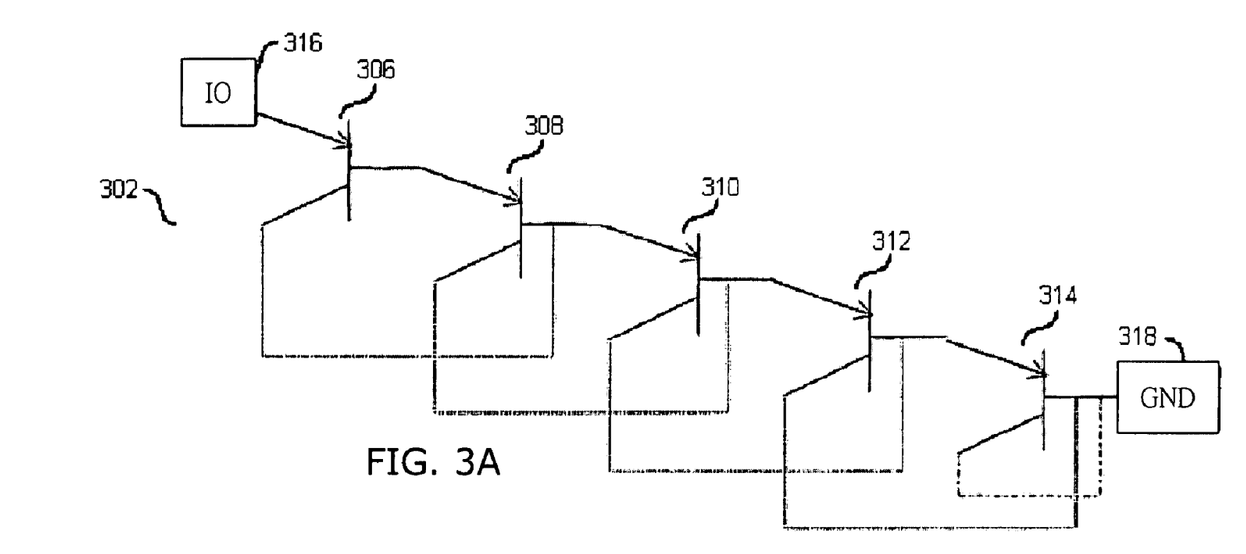
FIGS. 3A and 3B illustrate a schematic and block diagram of an ESD protection circuit in accordance with another embodiment of the present invention.
Figure 3B:
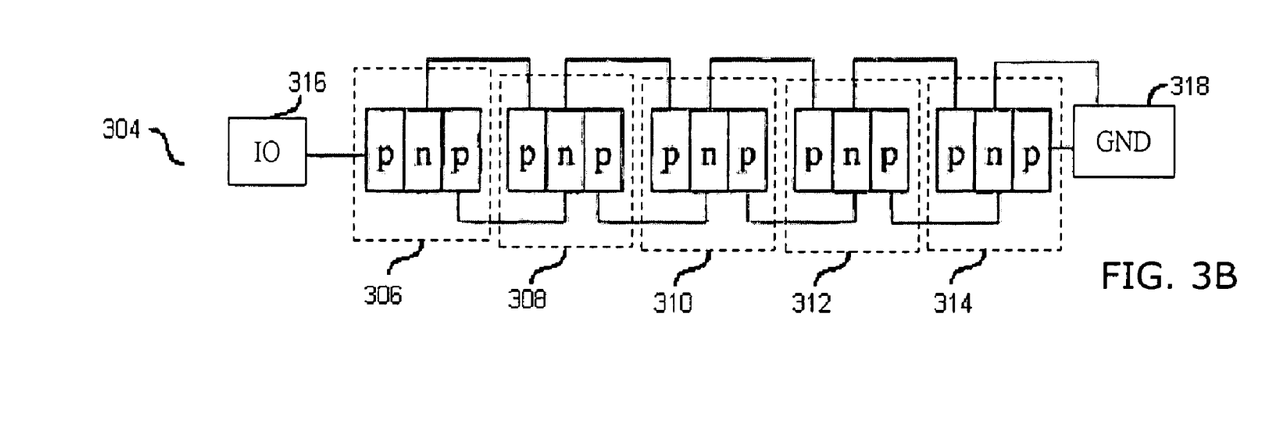

FIGS. 3A and 3B illustrate an ESD protection circuit 302 and its block diagram 304 equivalent with five lateral PNP bipolar transistors connected as a chain in accordance with another embodiment of the present invention. In the circuit 302, five lateral PNP bipolar transistors 306, 308, 310, 312, and 314 are connected together in a transistor chain. The emitter of the lateral PNP bipolar transistor 306 is connected to an I/O pad 316. Each collector of the lateral PNP bipolar transistors 306, 308, 310, and 312 is connected to the base of a subsequent lateral PNP bipolar transistor which is closer to a ground pad 318, while the base of each of the lateral PNP bipolar transistors 306, 308, 310, and 312 is also connected to the emitter of a subsequent lateral PNP bipolar transistor that is closer to the ground pad 318. Since the lateral PNP bipolar transistor 314 is the last transistor of the chain, its collector and base are both tied to the ground pad 318.

The block diagram 304 is equivalent to the circuit 302, where the five lateral PNP bipolar transistors 306, 308, 310, 312, and 314 are connected as a chain and implemented between the I/O pad 316 and the ground pad 318. Each lateral PNP bipolar transistor is divided into three sections where the P on the left represents a P+ doped region used as the emitter of the transistor, the N in the middle represents an N+ doped region used as the base of the transistor, and the P on the right represents a P+ doped region used as the collector of the transistor. The connections between the transistors and pads are the same as the connections within the circuit 302.

In this configuration, each lateral PNP bipolar transistor is tied to the next transistor, thereby allowing the collector-to-base voltage (Vcb) of the lateral PNP bipolar transistors 306, 308, 310, and 312 to be equal to a voltage drop (Vd) across a bipolar transistor. In normal operation, the operation voltage is not high enough to turn on all five lateral PNP bipolar transistors of the transistor chain. When ESD occurs, the high ESD voltage will enter the circuit 302 through the I/O pad 316 to reach the lateral PNP bipolar transistor 306. The voltage at the emitter of the bipolar transistor 306 will be high enough to turn it on. The ESD current then flows from the collector of the bipolar transistor 306 to the base of the bipolar transistor 308 and the emitter of the bipolar transistor 310. Since the collector of the bipolar transistor 306 has the same voltage as that at the base of the bipolar transistor 308, the Vcb of the bipolar transistor 306 is equal to the Vd, the voltage drop across the bipolar transistor 308. This helps to turn on the bipolar transistor 306 during an ESD event, such that a part of ESD current will flow from the I/O pad 316 through the bipolar transistor 306 to the emitters of the bipolar transistors 308 and 310. The same electric behavior continues for the remaining lateral PNP bipolar transistors 310 and 312 until the transistor chain opens up a current path from the I/O pad 316 to the ground pad 318 to dissipate the ESD charges.

It is understood by those skilled in the art that more or less than five lateral bipolar transistors can be used, and that the transistors can be either PNP or NPN.

Figure 3C:
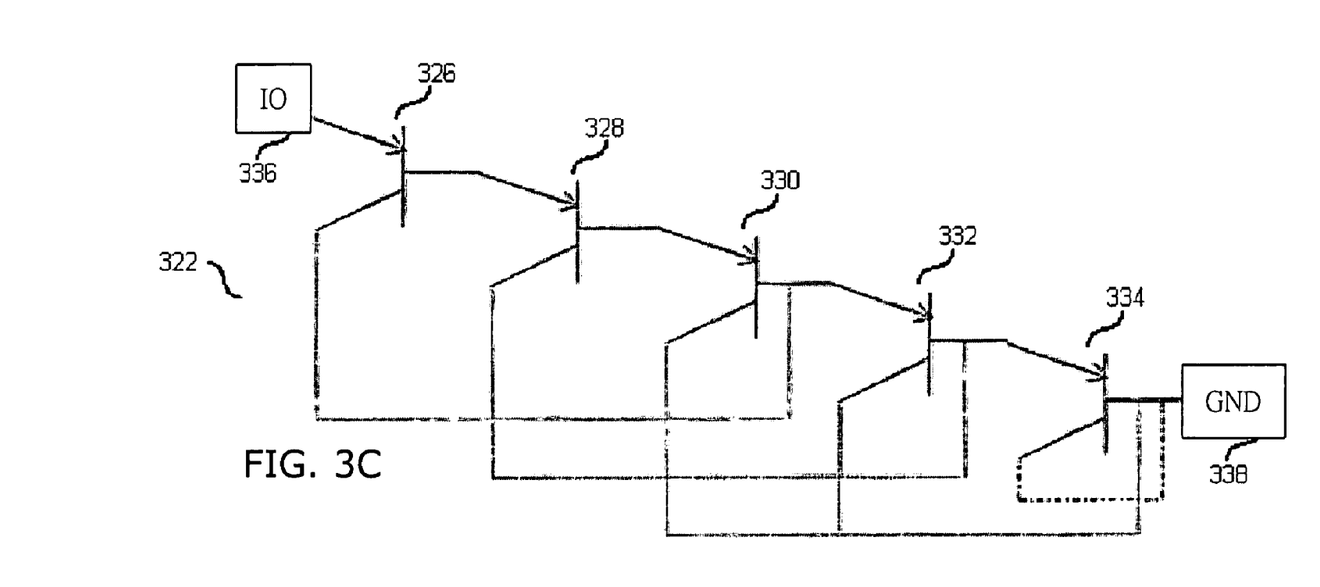
FIGS. 3C and 3D illustrate a schematic and block diagram of an ESD protection circuit in accordance with another embodiment of the present invention.
Figure 3D:
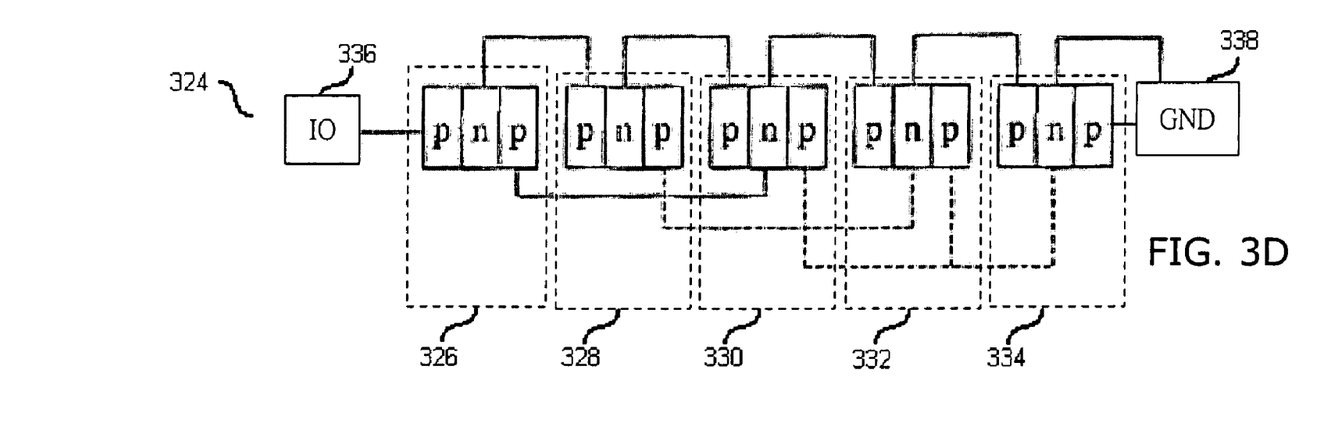

FIGS. 3C and 3D illustrate an ESD protection circuit 322 and its block diagram 324 equivalent with five lateral PNP bipolar transistors connected as a chain in accordance with another embodiment of the present invention. In the circuit 322, five lateral PNP bipolar transistors 326, 328, 330, 332, and 334 are connected in a transistor chain. The emitter of the lateral PNP bipolar transistor 326 is connected to an I/O pad 336, while its collector is connected to the base of the lateral PNP bipolar transistor 330. The collector of the lateral PNP bipolar transistor 328 is connected to the base of the lateral PNP bipolar transistor 332, while the collectors of the lateral PNP bipolar transistors 330 and 332 are connected to the base of the lateral PNP bipolar transistor 334. Due to the length of the circuit 322, the collector of the lateral PNP bipolar transistor 334 will be tied directly to the ground pad 338. The bases of lateral PNP bipolar transistors 326, 328, 330, and 332 are all connected to the emitter of a subsequent transistor, which is closer to the ground pad 338, and since the lateral PNP bipolar transistor 334 is the last transistor of the chain, its collector and base are both tied to the ground pad 338.

The block diagram 324 is equivalent to the circuit 322, where the five lateral PNP bipolar transistors 326, 328, 330, 332, and 334 are connected as a chain and implemented between the I/O pad 336 and the ground pad 338. Each lateral PNP bipolar transistor is divided into three sections where the P on the left represents a P+ doped region used as the emitter of the transistor, the N in the middle represents an N+ doped region used as the base of the transistor, and the P on the right represents a P+ doped region used as the collector of the transistor. The connections between the lateral PNP bipolar transistors and pads are the same as the connections within the circuit 322.

With collectors of the lateral PNP bipolar transistors 326, 328, and 330 skipping a transistor before being connected to the base of another transistor, the Vcb of lateral PNP bipolar transistors 326, 328, and 330 is equal to two times Vd. Vcb of the lateral PNP bipolar transistor 332 is equal to one Vd. Since both the base and the collector of the lateral PNP bipolar transistor 334 are connected directly to ground, the collector-to-base junction of lateral PNP bipolar transistor 334 will be shorted.

The normal operation voltage is not high enough to turn on all five lateral PNP bipolar transistors of the circuit 322 during normal operation. When ESD occurs, the high voltage will enter the circuit 322 through the I/O pad 336 to reach the lateral PNP bipolar transistor 326. Since the collector of the lateral PNP bipolar transistor 326 is connected directly to the base of lateral PNP bipolar transistor 330, the high voltage will turn on the lateral PNP bipolar transistor 326, thereby allowing high voltage to continue to the emitters of the bipolar transistors 330 and 328. The collectors of the lateral PNP bipolar transistors 328 and 330 will then also provide the high voltage to the base of the lateral PNP bipolar transistor 332, thereby opening up a current path from the I/O pad 336 to the ground pad 338 to dissipate the ESD charges. This method can speed up the response to and improve ESD performance.

It is understood that more or less than five lateral bipolar transistors can be used in this embodiment, and that the transistors can be either PNP or NPN.

Figure 3E:
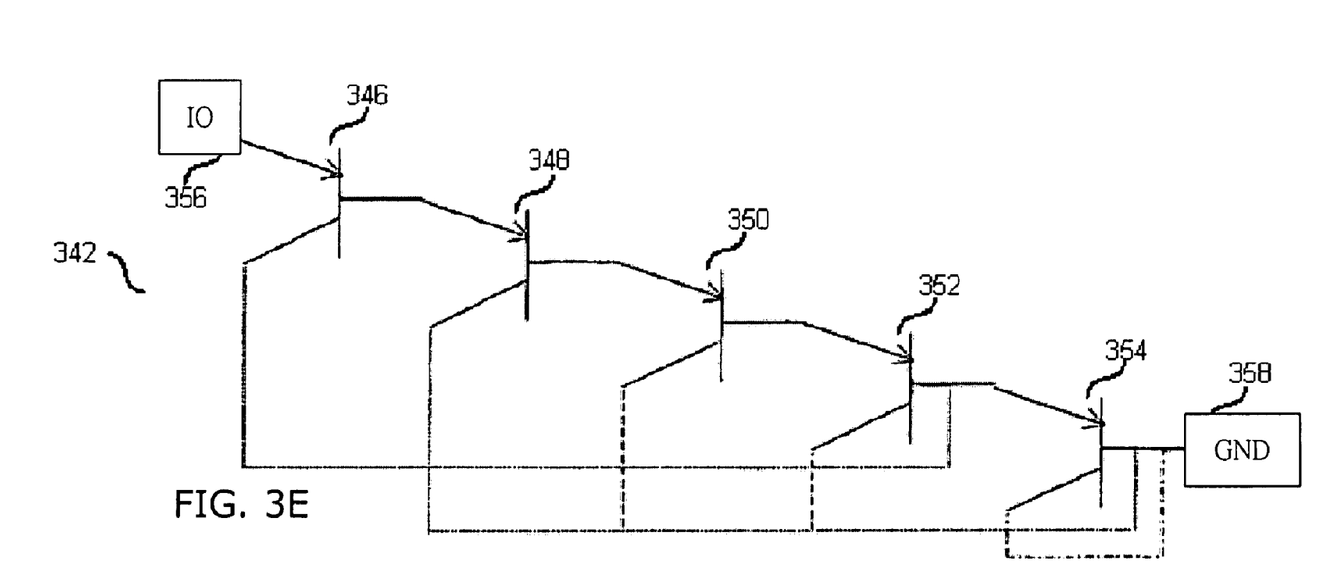
FIGS. 3E and 3F illustrate a schematic and block diagram of an ESD protection circuit in accordance with another embodiment of the present invention.
Figure 3F:
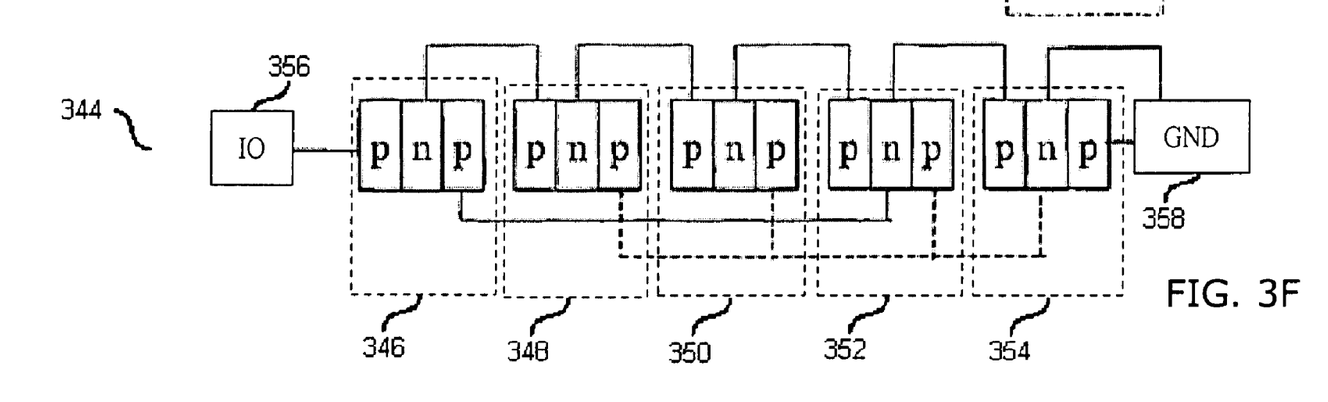

FIGS. 3E and 3F illustrate an ESD protection circuit 342 and its block diagram 344 equivalent with five lateral PNP bipolar transistors connected as a chain in accordance with another embodiment of the present invention. The circuit 342 is composed of five lateral PNP bipolar transistors 346, 348, 350, 352, and 354. The emitter of the lateral PNP bipolar transistor 346 is connected to an I/O pad 356, while the collector is connected to the base of the lateral PNP bipolar transistor 352. The collector of each of the lateral PNP bipolar transistors 348, 350, and 352 is connected to the base of the lateral PNP bipolar transistor 354. Due to the length of the circuit 342, the collector of the lateral PNP bipolar transistor 354 will be tied directly to the ground pad 358. The base of each of the lateral PNP bipolar transistors 346, 348, 350, and 352 is connected to the emitter of a subsequent transistor that is closer to the ground pad 358, and since the lateral PNP bipolar transistor 354 is the last transistor of the chain, its collector and base are both tied to the ground pad 358.

The block diagram 344 is equivalent to the circuit 342 where the five lateral PNP bipolar transistors 346, 348, 350, 352, and 354 are connected as a chain and implemented between the I/O pad 356 and the ground pad 358. Each lateral PNP bipolar transistor is divided into three sections, where the P on the left represents a P+ doped region used as the emitter of the transistor, the N in the middle represents an N+ doped region used as the base of the transistor, and the P on the right represents a P+ doped region used as the collector of the transistor. The connections between the transistors and pads are the same as the connections within the circuit 342.

With collectors of the lateral PNP bipolar transistors 346 and 348 skipping two transistors before connecting to the base of another transistor, the Vcb of the lateral PNP bipolar transistors 346 and 348 is equal to three times Vd. Vcb of the lateral PNP bipolar transistor 350 is equal to two times Vd. Being the second to the last transistor in the chain, the lateral PNP bipolar transistor 352 will have a Vcb equal to one Vd. Since the collector of the lateral PNP bipolar transistor 354 is connected directly to ground, the base and collector of the lateral PNP bipolar transistor 354 will be shorted.

The normal operation voltage is not high enough to turn on all five lateral PNP bipolar transistors of the transistor chain during normal operation. When an ESD event occurs, the high ESD voltage will enter the circuit 342 through the I/O pad 356 to turn on the bipolar transistors 346, 348, 350, 352 and 354, thereby opening up a current path from the I/O pad 356 to the ground pad 358 to dissipate the ESD charges.

The trigger-on voltage of the ESD protection circuit can be adjusted by varying the collector-to-base voltage Vcb, which can be achieved by connecting the collector of a bipolar transistor to the base of a subsequently connected bipolar transistor. Zero or a number of bipolar transistors can be sequentially connected between that bipolar transistor and that subsequently connected bipolar transistor. As such, the invention provides an ESD protection circuit whose trigger-on voltage can be flexibly adjusted by varying the number of the bipolar transistors to achieve an early turn-on during an ESD event.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrostatic discharge (ESD) protection circuit for dissipating an ESD current from a first pad to a second pad during an ESD event, the circuit comprising:
    a first bipolar transistor having an emitter coupled to the first pad;
    a second bipolar transistor having a base and a collector coupled to the second pad; and
    one or more bipolar transistors sequentially coupled between the first and second bipolar transistors in a base-to-emitter manner,
    wherein each collector of the first bipolar transistor and the sequentially coupled transistors is connected to a base of a subsequently coupled bipolar transistor for helping to turn on the first, second and sequentially coupled bipolar transistors to provide a current path from the first pad to the second pad during an ESD event,
    wherein a number of bipolar transistors separating the first bipolar transistor and the subsequently coupled bipolar transistor varies to adjust a trigger-on voltage of the ESD protection circuit.

2. The ESD protection circuit of claim 1 wherein the first, second and sequentially coupled bipolar transistors are laterally constructed on a semiconductor substrate.

3. The ESD protection circuit of claim 2 wherein the first, second and sequentially coupled transistors are PNP bipolar transistors.

4. The ESD protection circuit of claim 3 wherein each one of the first, second and sequentially coupled transistors is constructed by a first P-type doped region, an N-type doped region and a second P-type doped region adjacently formed on an N-type well in the semiconductor substrate.

5. The ESD protection circuit of claim 4 further comprising a P-type doped region constructed between two adjacent PNP bipolar transistors on the semiconductor substrate for reducing leakage current through the first, second and sequentially coupled bipolar transistors in a normal operation state.

6. The ESD protection circuit of claim 2 wherein the first, second and sequentially coupled transistors are NPN bipolar transistors.

7. The ESD protection circuit of claim 6 wherein each one of the first, second and sequentially coupled transistors is constructed by a first N-type doped region, a P-type doped region and a second N-type doped region adjacently formed on a P-type well in the semiconductor substrate.

8. The ESD protection circuit of claim 7 further comprising an N-type doped region constructed between two adjacent NPN bipolar transistors on the semiconductor substrate for reducing leakage current through the first, second and sequentially coupled bipolar transistors in a normal operation state.

9. A semiconductor structure serving as an electrostatic discharge (ESD) protection circuit for dissipating an ESD current from a first pad to a second pad during an ESD event, the structure comprising:
- a semiconductor substrate having a first well and a second well;
- a first doped region of a first polarity type formed on the first well and connected to the first pad;
- a second doped region of the first polarity type formed adjacent to the first doped region on the first well;
- a third doped region of a second polarity type formed between the first and second doped regions, the first, second and third doped regions serving as an emitter, collector and base of a first bipolar transistor, respectively;
- a fourth doped region of the first polarity type formed on the second well, and connected to the second pad;
- a fifth doped region of the first polarity type formed adjacent to the fourth doped region on the second well;
- a sixth doped region of the second polarity type formed between the fourth and fifth doped regions, the fourth, fifth and sixth doped regions serving as an emitter, collector and base of a second bipolar transistor, respectively; and
- one or more bipolar transistors, each of which is constructed by three adjacent doped regions of alternating types of polarity, sequentially coupled between the first and second bipolar transistors in a base-to-emitter manner,
- wherein each collector of the first bipolar transistor and the sequentially coupled transistors is connected to a base of a subsequently coupled bipolar transistor for helping to turn on the first, second and sequentially coupled bipolar transistors to provide a current path from the first pad to the second pad during an ESD event.

10. The semiconductor structure of claim 9 wherein a number of bipolar transistors separating the first bipolar transistor and the subsequently coupled bipolar transistor varies to adjust a trigger-on voltage of the ESD protection circuit.

11. The semiconductor structure of claim 9 wherein the first polarity type is positive and the second polarity type is negative.

12. The semiconductor structure of claim 9 wherein the first polarity type is negative and the second polarity type is positive.

13. The semiconductor structure of claim 9 further comprising a doped region of the first polarity type constructed between two adjacent bipolar transistors on the semiconductor substrate f or reducing leakage current through the first, second and sequentially coupled bipolar transistors in a normal operation state.

14. An electrostatic discharge (ESD) protection circuit for dissipating an ESD current from a first pad to a second pad, the circuit comprising:
- a first bipolar transistor laterally formed on a semiconductor substrate, having an emitter coupled to the first pad;
- a second bipolar transistor, laterally formed on the semiconductor substrate, having a base and a collector coupled to the second pad;
- one or more bipolar transistors, laterally formed on the semiconductor, sequentially coupled between the first and second lateral bipolar transistors in a base-to-emitter manner; and
- a doped region fanned between two adjacent bipolar transistors on the semiconductor substrate for reducing leakage current through the first, second and sequentially coupled bipolar transistors in a normal operation state,
- wherein each collector of the first bipolar transistor and the sequentially coupled transistors is connected to a base of a subsequently coupled bipolar transistor for helping to turn on the first, second and sequentially coupled bipolar transistors to provide a current path from the first pad to the second pad during an ESD event.

15. The ESD protection circuit of claim 14 wherein a number of bipolar transistors separating the first bipolar transistor and the subsequently coupled bipolar transistor varies to adjust a trigger-on voltage of the ESD protection circuit.

16. The ESD protection circuit of claim 14 wherein the first, second and sequentially coupled transistors are PNP bipolar transistors.

17. The ESD protection circuit of claim 14 wherein each one of the first, second and sequentially coupled transistors is constructed by a first P-type doped region, an N-type doped region and a second P-type doped region adjacently formed on an N-type well in the semiconductor substrate.

18. The ESD protection circuit of claim 14 wherein the first, second and sequentially coupled transistors are NPN bipolar transistors.

19. The ESD protection circuit of claim 14 wherein each one of the first, second and sequentially coupled transistors is constructed by a first N-type doped region, a P-type doped region and a second N-type doped region adjacently formed on a P-type well in the semiconductor substrate.

* * * * *